United States Patent [19]

Lunardi et al.

[11] Patent Number: 4,825,265

[45] Date of Patent: Apr. 25, 1989

[54] TRANSISTOR

[75] Inventors: Leda M. Lunardi, New Providence; Roger J. Malik, Summit, both of N.J.

[73] Assignee: American Telephone and Telegraph Company AT&T Bell Laboratories, Murray Hill, N.J.

[21] Appl. No.: 94,633

[22] Filed: Sep. 4, 1987

[51] Int. Cl.$^4$ .................... H01L 29/72; H01L 29/205
[52] U.S. Cl. ........................... 357/16; 357/34; 357/89; 357/56
[58] Field of Search .............. 357/34, 16, 89

[56] References Cited

U.S. PATENT DOCUMENTS 3,780,359 12/1973 Dumke et al. .................. 357/16
4,410,902 10/1983 Malik ............................ 357/89
4,691,215 9/1987 Luryi ............................ 357/16

FOREIGN PATENT DOCUMENTS 0183146 6/1986 European Pat. Off. ......... 357/34

OTHER PUBLICATIONS

Asbeck et al., "Digital GaAs Circuits" ISSCC 22 Feb. 1984 *IEEE Int. Sol. State. Cir. Conf.* pp. 50–51.
Chang et al., "MBE ... Barrier Transistor" *IEEE Elect. Dev. Letters* vol. EDL-6 No. 3 Mar. 1985 pp. 123–125.
*IEEE Trans. Electron Dev.*, vol. ED-32, p. 2345, 1985, G. W. Taylor et al.
*IEEE Electron Dev. Lett.*, vol. ED-33, p. 1845, 1986, K. Matsumoto et al.

*Primary Examiner*—Andrew J. James
*Assistant Examiner*—Jerome Jackson, Jr.
*Attorney, Agent, or Firm*—Eugen E. Pacher

[57] ABSTRACT

A transistor is described which the base region comprises a submonolayer of essentially only dopant atoms. One embodiment is a GaAs/AlGaAs heterojunction bipolar transistor in which the base region comprises a submonolayer of Be atoms. The effective base transit time is negligible in these transistors.

8 Claims, 2 Drawing Sheets

TRANSISTOR

BACKGROUND OF THE INVENTION

This invention relates to transistors and, more particularly, to heterojunction bipolar transistors (HBTs).

In a typical HBT the emitter is made of a wider bandgap semiconductor than the base in order to increase the emitter injection efficiency and to prevent minority carrier injection from the base into the emitter. Although HBTs can be fabricated from a variety of materials (e.g., Group III–V compounds), most attention is focused on attaining high speed operation of devices in the AlGaAs/GaAs materials system. The switching speed of an HBT, like many other semiconductor devices, is limited by parasitic resistance (R) and capacitance (C). Thus, the rapid progress recently made in increasing the operating speed of AlGaAs/GaAs HBTs can be attributed mainly to a reduction in parasitic RC time constants; that is, by reducing lateral dimensions using various self-aligned processes, by reducing the collector capacitance with buried ion implantation, and by lowering the emitter contact resistance using a non-alloyed emitter contact on an epitaxial n+-InGaAs contact-facilitating layer. Even with the success of these techniques, however, there still exists a fundamental limit on the speed of the HBT which is governed by the emitter-collector transit time delay associated with the electron velocity through the emitter, base, and collector regions.

One of the major delays is caused by the base transit time $\gamma_B$ which is determined by carrier diffusion through the neutral base region and can be expressed as $$\gamma_B = W_B^2/2D_e \quad (1)$$

where $W_B$ is the base width and $D_e$ is the electron minority carrier diffusion coefficient. One way to decrease the base transit time is to introduce a quasi-electric field by grading the alloy composition (and hence bandgap) in the base to increase the electron velocity. It has been shown experimentally that the base transit time can be significantly reduced by alloy grading in the base, in which case the base transit time is given by $$\gamma_B = W_B/V_e = W_B/\mu_e F \quad (2)$$

where $v_e$ is the electron velocity, $\mu_e$ is the electron mobility, and F is the quasi-electric field in the base. It should be noted for thin based with $W_B < 0.1$ μm, equations (1) and (2) do not strictly apply due to boundary value problems and non-equilibrium transport effects. Nevertheless, it is clear that in the limiting case of vanishing base-width, the base transit time goes to zero:

$$\lim_{W_B \to 0} \tau_B = 0 \quad (3)$$

A few bipolar-type transistors have been proposed which contain a voltage-induced two-dimensional hole base such as the biplar inversion channel field effect transistor (BICFET) described by G. W. Taylor et al, *IEEE Trans. Electron Dev.*, Vol. ED-32, p. 2345 (1985) and the inversion base bipolar transistor (IBT) described by K. Matsumoto et al, *IEEE Electron Dev. Lett.*, Vol. EDL-7, p. 627 (1986). Both devices have effective base widths below 100 Å. However, these transistors do not have a neutral base region and hence have a high base resistance and require self-alignment of the base and emitter contacts.

SUMMARY OF THE INVENTION

In one aspect, the invention comprises a transistor having emitter, base and collector regions in which the base region comprises a submonolayer of dopant atoms. Illustratively, the submonolayer is formed by interrupting molecular beam epitaxy (MBE) growth and depositing the dopant atoms before resuming MBE growth.

In one embodiment, the transistor is a HBT and the submonolayer is set back from the emitter region by a distance not less than the diffusion length of the dopant atoms and preferably at least several diffusion lengths so that if the dopant atoms diffuse into the emitter, they do not form a p-n junction there. This device has been designated the Planar Doped Base Heterojunction Bipolar Transistor (PDB-HBT) because the base can be viewed as the limiting case where the doping, which is distributed through out the three-dimensional base of a conventional HBT, is compressed down to two dimensions (i.e., an atomic plane). The effective base transit time of these transistors is negligible and very fast hot electron transport is expected to occur in the collector region.

BRIEF DESCRIPTION OF THE DRAWING(S)

The invention, together with its various features and advantages, can be readily understood from the following more detailed description taken in conjunction with accompanying drawing, in which.

DETAILED DESCRIPTION

Figure 1:
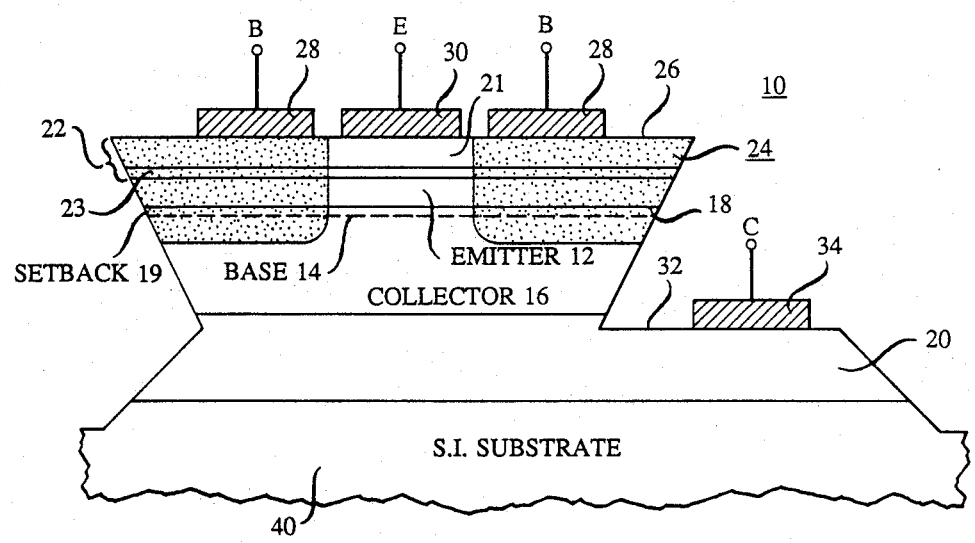
FIG. 1 is a schematic cross-sectional view of an HBT in accordance with one embodiment of the invention.

Turning now to FIG. 1, there is shown a transistor 10 comprising an emitter region 12, a base region 14 and a collector region 16. The emitter and collector regions have one conductivity type, and the base region comprises a submonolayer of dopant atoms of the opposite conductivity type.

The term monolayer means a plane of atoms which has the thickness of the diameter of the atoms, whereas a submonolayer means that the atoms in plane do not cover the entire plane. The term coverage refers to the fraction (or percent of the growth surface area covered by the dopant atoms. Thus, a submonolayer means that the portions of the underlying surface (e.g., semiconductor) are exposed which facilitates nucleation when a layer is grown over the submonolayer. Because the electron wave function extends over distances greater than the typical separation between dopant atoms for even small coverages (e.g., about 28 Å for 1% coverage or about 9 Å for 10% coverage), the uncovered portions do not create short circuits between the emitter and collector regions.

The phrase "dopant atoms of opposite conductivty type" means that, if the emitter and collector regions are n-type semiconductors, then the dopant atoms are acceptors; and conversely, if they are p-type, then the dopant atoms are donors.

In one embodiment, the transistor 10 is a HBT in which the emitter region 12 is a wider bandgap semiconductor than the collector region 16 and the base region 14 is separated from this emitter region 12 (i.e., from the heterojunction 18) by a distance not less than the diffusion length of the dopant atoms in the base region 14, and preferably not less than several diffusion lengths. This separation is achieved by a setback or spacer layer 19 which has a narrower bandgap than the emitter region and is undoped or unintentionally doped. The purpose of the setback layer 19 is to significantly reduce the number of dopant atoms which diffuse into the emitter region 12 where they could disadvantageously form a displaced p-n junction, allow minority carrier injection in the emitter, and lower current gain. Obviously, therefore, some of the dopant atoms may diffuse into the setback layer 19, but the latter does not become part of the base region because the setback layer is undoped and, even with the in-diffusion of dopant atoms, has about several orders of magnitude less carrier concentration than the base region (e.g., $10^{15}$–$10^{16}$/cm$^3$ in the setback compared to $>10^{18}$ in the base). Thus, even after such diffusion, the base region constitutes essentially an atomic plane of dopant atoms in which the base transit time is negligible.

In an illustrative embodiment the transistor 10 is also provided with a contact-facilitating region 20 to the collector and a contact-facilitating region 22 to the emitter. Electrical contact means to the base region 14 includes a high conductivity zone 24 which extends from a first major surface 26 of region 22 to at least the depth of the base region 14 and has the same conductivity type as the base. Zone 24 is typically annular with an annular base electrode 28 disposed thereon. An emitter electrode 30 is also disposed on the surface 26 within the annulus of zone 24. Contact to the collector is achieved by forming the device in the shape of a mesa which exposes a second major surface 32 of the contact-facilitating region 20. Collector electrode 34 is disposed on surface 32.

Example

The following example describes an AlGaAs/GaAS PDB-HBT in accordance with one embodiment of the invention. Various materials, dimensions, and other parameters of the device and its operating conditions are provided by way if illustration only and, unless otherwise stated, are not intended to limit the scope of the invention.

The structure of the PDB-HBT, which was grown by MBE, comprised the following: a semi-insulating GaAs substrate 40, a 1 μm thick GaAs collector contact-facilitating layer 20 doped n+-type to $3 \times 10^{18}$/cm$^3$ and a 0.5 μm thick GaAs collector region 16 doped n-type to $5 \times 10^{16}$/cm$^3$. A p+-type base region 14 was formed by depositing a submonolayer of Be atoms after interrupting MBE growth (an As beam was kept on during Be deposition to reduce As evaporation from the surface of the semiconductor). The sheet hole concentration of the base region was in the range of $0.5$–$5.0 \times 10^{13}$/cm$^2$ which corresponds to submonolayer coverage of about 1–10%. Larger coverages are also suitable up to nearly 100% which occurs at a concentration of about $6 \times 10^{14}$/cm$^2$. An undoped (unintentionally doped) GaAS setback layer 19 about 50–200 Å thick was grown over the Be submonolayer, and then a 0.2 μm thick Al$_{0.3}$Ga$_{0.7}$As emitter region 12 doped n-type to $5 \times 10^{17}$/cm$^3$ was grown on the setback layer. The diffusion length of Be in GaAs at about 600° C. (a typical MBE growth temperature) is less than about 20 Å. Consequently, SIMS measurements indicated that there was negligible Be diffusion into the emitter. The emitter contact-facilitating region 22 was then formed by first growing a 500 Å thick Al$_x$Ga$_{1-x}$As layer 23 doped n+-type to $3 \times 10^{18}$/cm$^3$ with composition graded from x=0.3 adjacent the emitter to x=0 at the final layer which was a 0.2 μm thick GaAs layer 21 doped n+-type to $3 \times 10^{18}$/cm$^3$. All n-type layers were doped with Si.

After epitaxial growth was completed, tranistor structures were fabricated using a combination of ion implantation and wet chemical etching to enable electrical contact to be made to the base and collector regions, respectively. Annular zone 24 was implanted with Be atoms at 25 KeV followed by Be atoms at 55 KeV and then subjected to rapid thermal annealing at 800° C. A AuBe annular base electrode 28 was deposited on zone 24. The emitter electrode comprised a AuGeNi alloy and was deposited in the annulus of the base electrode. The emitter area was approximately $8 \times 10^{-5}$ cm$^2$. Wet chemical etching was used to shape the mesa and expose the contact-facilitating layer 20. A AuGeNi collector electrode 34 was deposited on the surface 32 of layer 20.

Figure 2:
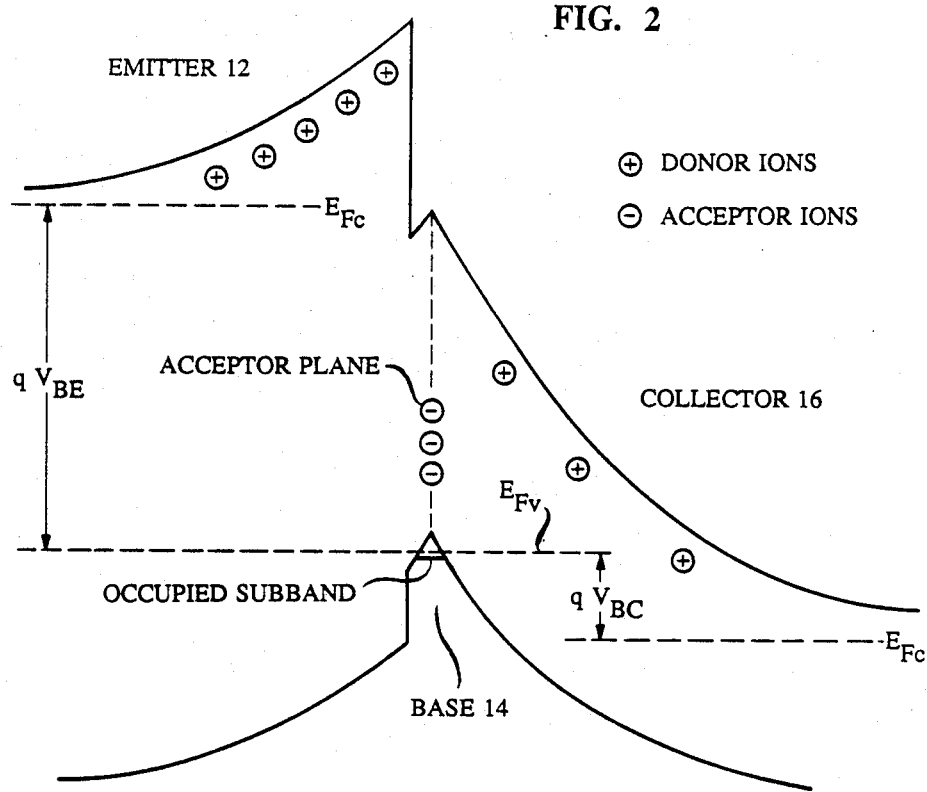
FIG. 2 is an energy band diagram of the emitter, base and collector regions of an HBT in accordance with the embodiment of FIG. 1.

A schematic of the energy-band diagram of the PDB-HBT is shown in FIG. 2 for the case where a forward bias voltage $V_{BE}$ is applied between base and emitter and reverse bias voltage $V_{BC}$ is applied between base and collectors. The quasi Fermi levels of the conduction band ($E_{Fc}$) and the valence band ($E_{Fv}$) are also shown. In this idealized model, the effects of the small amount of Be diffusion from the plane of the submonolayer are neglected. FIG. 2 shows that the emitter and collector depletion regions merge near the plane of the base region which is designated the acceptor plane. The effective base width, the width of the region in which holes are confined, is estimated to be less than 100 Å. The holes occupy one or more two-dimensional energy subbands in a quantum well located approximately at the accetor plane. Since the two-dimensional base is heavily doped, the base resistance is sufficiently low that self-alignment of the emitter and base contacts is not essential. Also, the base transit time is negligible because the effective base width is much thinner than that found in conventional HBTs. This feature should also lead to enhanced current gains due to the absence of recombination within the base region. Instead, the current gain of the PDB-HBT is determined by other factors including interface and surface recombination.

Another advantage of the PDB-HBT is the possibility of exploiting hot electron transport in the collector depletion region. Electrons which are injected over the emitter barrier will be ballistically accelerated by the heterojunction conduction band discontinuity through the base into the collector. It has been previously shown that the base region in a conventional HBT is very effective in scattering hot electrons, although there is evidence that abrupt versus graded emitters have some advantage in reducing the base transit time. However, for the case of the PDB-HBT, direct injection of hot electrons into the collector may result in very short electron transit times.

Figure 3:
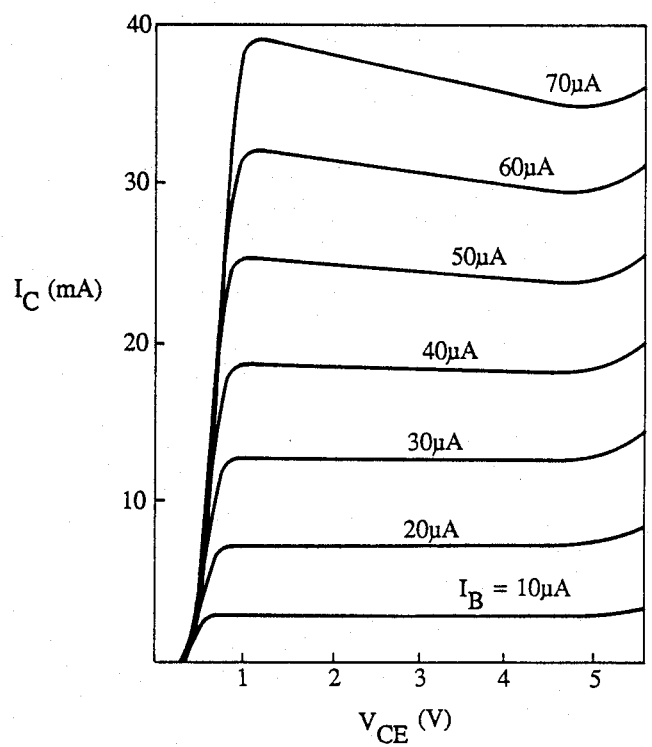
FIG. 3 shows a family of common emitter I-V curves of the HBT of FIG. 1 for a variety of base currents $I_B$.

The common emitter DC characteristic of the PDB-HBT transistor is shown in FIG. 3. In this particular transistor, the sheet doping concentration of the base region was $2.5 \times 10^{13}$ cm$^{-2}$. The device had a maximum gain of 700 at a collector current of 100 mA. This current gain is a factor of 2-6 times greater than that observed in our conventional HBTs with base-widths of 0.1 μm. Also note that the collector current saturation characteristics are flat which indicates there is very little base width modulation (Early effect); the absence of this effect is due to the high base sheet doping concentration and the narrow-base width. The apparent negative resistance at high collector currents is due to thermal heating effects and is generally not a problem because the device can be operated in such a way to limit the power dissipation and hence alleviate the effect.

Figure 4:
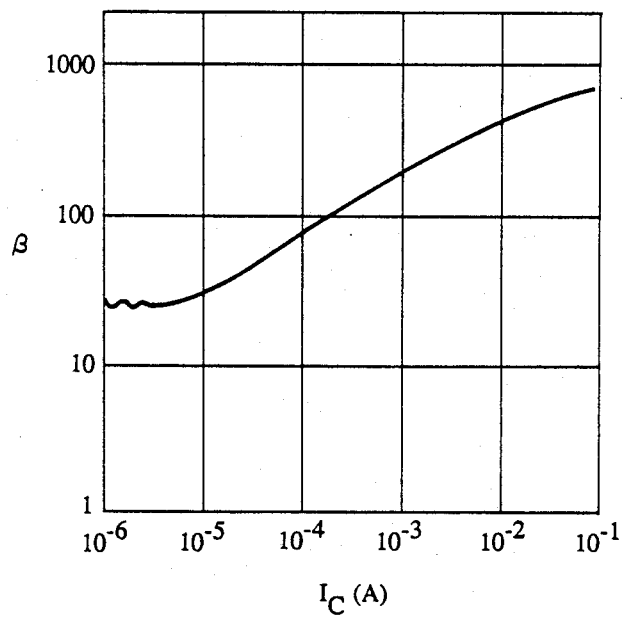
FIG. 4 shows a graph of the current gain $\beta$ versus collector current HBT of FIG. 1.

The dependence of current gain $\beta$ on collector current density is shown in FIG. 4. It is seen that $\beta$ is approximately proportional to $I_C$ to the $\frac{1}{3}$ power. In contrast, AlGaAs/GaAs HBTs which are dominated by surface recombination, $\beta$ is proportional $I_C$ to the $\frac{1}{2}$ power. Thus, in the PDB-HBT it appears that the current gain is limited by a mixture of recombination at the heterojunction and at the surface of the extrinsic base.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, HBTs in accordance with the invention can be fabricated from other material systems such as InP/InGaAs or InAlAs/InGaAs where InP and InAlAs are the wider bandgap semiconductors, respectively.

What is claimed is:

1. A bipolar transistor comprising a semiconductor body comprising an emitter region, a collector region, and a base region between the emitter and collector regions, with
   (a) the emitter and collector regions comprising semiconductor material of one conductivity type;
   (b) the base region comprising a submonolayer of dopant atoms providing to the base region charge carriers imparting a conductivity type opposite to the conductivity type of the emitter and collector regions; and
   (c) associated with the emitter and collector region semiconductor materials being an emitter bandgap and a collector bandgap, respectively, characterized in that
   (d) the emitter region has a relatively wide bandgap;
   (e) the collector region has a bandgap that is narrower than the bandgap of the emitter region, whereby a quantum well is formed between the emitter region and the collector region; and
   the semiconductor body further comprises an undoped or unintentionally doped semiconductor setback layer having associated therewith a bandgap and a diffusion length for the base dopant atoms, the setback layer;
   (f) being disposed between the submonolayer and the emitter region,
   (g) having a bandgap narrower than the bandgap of the emitter region, and
   (h) having a thickness such that the charge carriers in the base region occupy one or more essentially two-dimensional energy sub-bands in the quantum well, the thickness furthermore being at least one diffusion length for the base-dopant atoms.

2. The transistor of claim 1 wherein said emitter and collector regions comprise Groups III–V compound semiconductors.

3. The transistor of claim 2 wherein said emitter region comprises AlGaAs and said collector region comprises GaAs.

4. The transistor of claim 3 wherein said body has a first major surface and said submonolayer lies below said surface, and including base contact means comprising a doped semiconductor zone of said opposite conductivity type which extends from said first surface to said submonolayer.

5. The transistor of claims 1, 2, 3 or 4 wherein said submonolayer is spaced from said emitter region by a distance of about 50–200 Å.

6. The transistor of claims 1, 2, 3 or 4 wherein said submonolayer has a sheet hole concentration of about $0.5 \times 10^{13}$/cm$^2$ to $5.0 \times 10^{13}$/cm$^2$.

7. The transistor of clam 4 wherein said body had the shape of a mesa formed adjacent a second major surface near the bottom of said mesa, said first major surface being located at the top of said mesa and said second major surface being located on a collector contact-facilitating layer, and further including base and emitter electrodes formed on said first surface and a collector electrode formed on said second surface.

8. A transistor comprising
   a first contact-facilitating region comprising an n-GaAs first layer and a graded bandgap n-AlGaAs second layer,
   an emitter region comprising an n-AlGaAs third layer adjacent said second layer,
   an undoped GaAs fourth layer about 50–200 Å thick adjacent said third layer,
   a base region comprising a submonolayer fifth layer of essentially only Be ions adjacent said fourth layer,
   a collector region comprising an n-GaAs sixth layer adjacent said fifth layer,
   a second contact facilitating region comprising an N+-GaAs seventh layer adjacent said sixth layer,
   said first through sixth layers being disposed in a mesa,
   electrical contact means to said fifth layer comprising an annular semiconductor region doped with acceptor atoms which extend from the top of said mesa to at least the depth of said fifth layer and a base electrode disposed on said first layer and on said annular region,
   an emitter electrode disposed on said first layer in the opening of said annular region, and
   a collector electrode disposed on said seventh layer.

* * * * *